（12） United States Patent
Hu et al.

(10) Patent No.: US 10,359,269 B2
(45) Date of Patent: Jul. 23, 2019

(54) FLEXIBLE ELECTRONICS FOR WEARABLE HEALTHCARE SENSORS

(71) Applicant: International Business Machines Corporation, Armonk, NY (US)

(72) Inventors: Huan Hu, Yorktown Heights, NY (US); Ning Li, White Plains, NY (US); Xiao Hu Liu, Briarcliff Manor, NY (US); Katsuyuki Sakuma, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 221 days.

(21) Appl. No.: 15/473,956

(22) Filed: Mar. 30, 2017

(65) Prior Publication Data

US 2018/0073854 A1  Mar. 15, 2018

Related U.S. Application Data

(63) Continuation of application No. 15/262,912, filed on Sep. 12, 2016, now Pat. No. 9,670,061.

(51) Int. Cl.
| | |
|---|---|
| *H01L 51/56* | (2006.01) |
| *H01L 51/50* | (2006.01) |
| *G01B 7/16* | (2006.01) |
| *B81C 1/00* | (2006.01) |
| *B81B 3/00* | (2006.01) |
| *G01L 1/22* | (2006.01) |

(52) U.S. Cl.
CPC .............. *G01B 7/20* (2013.01); *B81B 3/0097* (2013.01); *B81C 1/0038* (2013.01); *B81B 2201/0214* (2013.01); *B81B 2207/07* (2013.01); *B81C 2201/0194* (2013.01); *G01L 1/2293* (2013.01)

(58) Field of Classification Search
CPC ........................ H01L 51/0097; B81C 1/0038
See application file for complete search history.

(56) References Cited

U.S. PATENT DOCUMENTS

| | | | |
|---|---|---|---|
| 6,360,615 | B1 | 3/2002 | Smela |
| 6,763,156 | B2 | 7/2004 | Palmer et al. |
| 7,893,810 | B2 | 2/2011 | Ohta et al. |
| 8,440,546 | B2 | 5/2013 | Nuzzo et al. |

(Continued)

OTHER PUBLICATIONS

Paul S. Andry, "Flexible Electronics for Wearable Healthcare Sensors," Related Application, U.S. Appl. No. 15/723,324, filed Oct. 3, 2017.

(Continued)

*Primary Examiner* — Moazzam Hossain
(74) *Attorney, Agent, or Firm* — Cantor Colburn LLP; Vazken Alexanian

(57) ABSTRACT

Aspects include a method of manufacturing a flexible electronic structure that includes a metal or doped silicon substrate. Aspects include depositing an insulating layer on a silicon substrate. Aspects also include patterning a metal on a silicon substrate. Aspects also include selectively masking the structure to expose the metal and a portion of the silicon substrate. Aspects also include depositing a conductive layer including a conductive metal on the structure. Aspects also include plating the conductive material on the structure. Aspects also include spalling the structure.

4 Claims, 16 Drawing Sheets

(56) References Cited

U.S. PATENT DOCUMENTS

| | | |
|---|---|---|
| 8,826,747 B2 | 9/2014 | Lee et al. |
| 8,927,338 B1 | 1/2015 | Bedell et al. |
| 9,029,238 B2 | 5/2015 | Andry et al. |
| 2003/0219969 A1 | 11/2003 | Saito et al. |
| 2003/0231819 A1 | 12/2003 | Palmer et al. |
| 2006/0057836 A1 | 3/2006 | Nagarajan et al. |
| 2010/0307572 A1 | 12/2010 | Bedell et al. |
| 2011/0027930 A1 | 2/2011 | El-Gamal et al. |
| 2011/0045577 A1 | 2/2011 | Bruzewicz et al. |
| 2013/0149817 A1 | 6/2013 | Jeon et al. |
| 2013/0243655 A1 | 9/2013 | Li et al. |
| 2013/0306971 A1 | 11/2013 | Bedell et al. |
| 2014/0057413 A1 | 2/2014 | Yang |
| 2014/0174519 A1 | 6/2014 | Rim et al. |
| 2014/0264676 A1* | 9/2014 | Gallagher .............. B81B 3/0021 257/427 |
| 2014/0312424 A1 | 10/2014 | Brawley et al. |
| 2015/0129276 A1 | 5/2015 | Shumaker et al. |
| 2015/0230720 A1 | 8/2015 | Hekmatshoartabari et al. |
| 2015/0237711 A1* | 8/2015 | Rogers ................ H01L 21/4867 174/251 |
| 2015/0380523 A1 | 12/2015 | Hekmatshoartabari et al. |
| 2016/0005700 A1 | 1/2016 | Rogers et al. |
| 2016/0087577 A1* | 3/2016 | Albadri .......... H01L 31/035281 136/255 |

OTHER PUBLICATIONS

List of IBM Patents or Patent Applications Treated as Related; (Appendix P), Filed Oct. 6, 2017; pp. 1-2.

C.W. Park et al., "Photolithography-Based Patterning of Liquid Metal Interconnects for Monolithically Integrated Stretchable Circuits," ACS Applied Materials & Interfaces, Web publication, Jun. 2, 2016, 7 pages.

Hu et al., "Super Flexible Sensor Skin Using Liquid Metal as Interconnect." IEEE Sensors Conference Paper, 2007, pp. 815-817.

K. Hiller et al., "Bonding and Deep RIE, a Powerful Combination for High-Aspect-Ratio-Sensors and Actuators," Proc. of SPIE, vol. 5715, 2005, pp. 80-91.

Kim et al., "A Biaxial Stretchable Interconnect With Liquid-Alloy-Covered Joints on Elastomeric Substrate," IEEE/ASME J. Microelectromech. Systems, vol. 18, pp. 138-146, Jan. 2009.

Zhuang et al., "Flexible Transducer Arrays with Through-Wafer Electrical Interconnects Based on Trench Refilling with PDMS," 20th International Conference on Micro Electro Mechanical Systems, 2007, pp. 73-76.

* cited by examiner

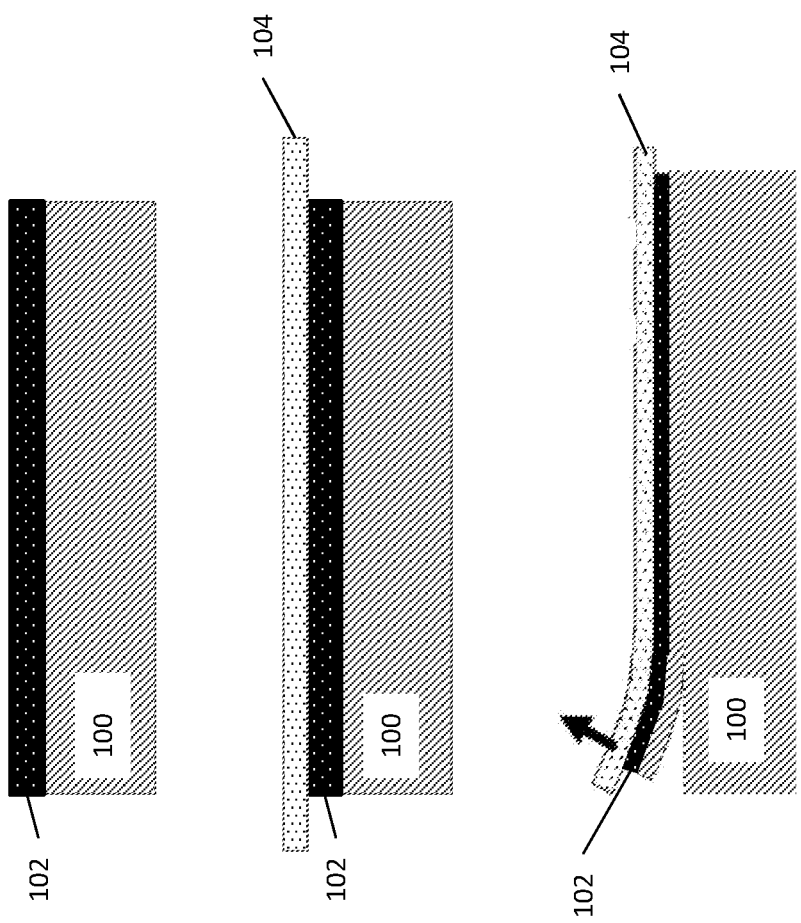

FLEXIBLE ELECTRONICS FOR WEARABLE HEALTHCARE SENSORS

DOMESTIC PRIORITY

This application is a continuation of and claims priority from U.S. patent application Ser. No. 15/262,912, filed on Sep. 12, 2016, entitled "FLEXIBLE ELECTRONICS FOR WEARABLE HEALTHCARE SENSORS", the entire contents of which are incorporated herein by reference.

BACKGROUND

The present invention relates to wearable healthcare sensors, and more specifically, to manufacture of flexible electronics for wearable health care sensors.

Health care sensors can present challenges in manufacture. For example, healthcare sensors or biosensors, in many applications, are to be applied to nonplanar or curvilinear surfaces, such as the surface of a finger or arm. One approach for manufacturing sensors capable of conforming to such surfaces involves the investigation of new materials, such as nanowires, carbon nanotubes, or nanocomposites. However, the complexity, reliability, and performance of such materials can be relatively poor compared to the performance of conventional solid-state electronics on a bulk substrate. The use of conventional semiconductor materials, such as silicon, offers potentially better performance and reliability in healthcare applications. However the use of conventional materials can pose challenges in manufacture when attempting to achieve a thickness that can sufficiently withstand the mechanical deformation needed to conform the semiconductor materials to nonplanar surfaces.

SUMMARY

In accordance with one or more embodiments, a method of manufacturing a flexible electronic structure is provided. The method includes depositing an insulating layer on a silicon substrate. The method also includes patterning a metal on a silicon substrate. The method also includes selectively masking the structure to expose the metal and a portion of the silicon substrate. The method also includes depositing a conductive layer including a conductive material on the structure. The method also includes plating the conductive material on the structure. The method also includes spalling the structure.

In accordance with another embodiment, a method for manufacturing a flexible electronic structure includes doping a silicon substrate with a dopant. The method also includes patterning a first photoresist layer on the structure to create a masked region and an unmasked region. The method also includes depositing a metal ohmic contact material on the structure. The method also includes removing the metal ohmic contact material from the first photoresist layer. The method also includes depositing a conductive layer on the structure. The method also includes patterning a second photoresist layer on the structure. The method also includes plating a conductive material on the structure. The method also includes adhering a UV release tape to the structure. The method also includes spalling the structure to create a thin layer of silicon below the unmasked region.

In accordance with yet another embodiment, a flexible electronic structure is provided. The structure includes a flexible silicon layer. The structure also includes a strain gauge metal or doped silicon region on top of the flexible silicon layer. The structure also includes a microchannel layer, the microchannel layer including a polymer (e.g. PDMS) layer with two or more vias. The structure also includes a liquid metal.

BRIEF DESCRIPTION OF THE DRAWINGS

The foregoing and other features and advantages of the one or more embodiments described herein are apparent from the following detailed description taken in conjunction with the accompanying drawings in which:

FIGS. 1A-1C illustrate one known process for forming a thinned down semiconductor using a spalling technique, in which:

FIG. 1A is a cross-sectional view of a semiconductor structure after deposition of a layer with tensile stress on a substrate;

FIG. 1B is a cross-sectional view of a semiconductor structure after deposition of a flexible handle on the layer with tensile stress; and FIG. 1C is a cross-sectional view of a semiconductor structure after lifting the layer with tensile stress to create a thin silicon ribbon.

FIGS. 2A-2I illustrate an exemplary fabrication process of forming flexible electronics using metal strain gauge according to one or more embodiments, in which:

FIG. 2A is a cross-sectional view of a semiconductor structure after growing an oxide layer on a silicon substrate;

FIG. 2B is a cross-sectional view of a semiconductor structure after patterning a metal structure;

FIG. 2C is a cross-sectional view of a semiconductor structure after patterning a photoresist layer on the structure;

FIG. 2D is a cross-sectional view of a semiconductor structure after depositing a metal conductive layer on the structure;

FIG. 2E is a cross-sectional view of a semiconductor structure after patterning a second photoresist layer on the structure;

FIG. 2F is a cross-sectional view of a semiconductor structure after plating conductive material on the exposed metal conductive layer;

FIG. 2G is a cross-sectional view of a semiconductor structure after depositing a tape on the structure and spalling;

FIG. 2H is a cross-sectional view of a semiconductor structure after depositing the structure on ultra violet (UV) release tape; and FIG. 2I is a cross-sectional view of a semiconductor structure after removing the tape, conductive layer, and photoresist layers from the structure to create a spalled device layer.

FIGS. 3A-3D illustrate an exemplary fabrication process of forming an microchannel layer for flexible electronics according to one or more embodiments, in which:

FIG. 3A is a cross-sectional view of a mold for a polymer (e.g. PDMS) microchannel structure after patterning a mask onto a mechanical support;

FIG. 3B is a cross-sectional view of a mold and a polymer (e.g. PDMS) structure after applying a polymer (e.g. polydimethyl siloxane (PDMS)) layer to the structure;

FIG. 3C is a cross-sectional view of a polymer microchannel structure after removing the mold and mechanical support;

FIG. 3D is a cross-sectional view of a polymer microchannel structure after forming vias in the polymer (e.g. PDMS) layer;

FIGS. 4A-4E illustrate an exemplary process of fabricating flexible electronics with an microchannel layer according to one or more embodiments, in which:

FIG. 4A is a cross-sectional view of a semiconductor structure after fabricating a spalled device layer;

FIG. 4B is a cross-sectional view of a semiconductor structure after depositing a transfer tape on the spalled device layer;

FIG. 4C is a cross-sectional view of a semiconductor structure after embedding the spalled structure in a polymer (e.g. PDMS) layer;

FIG. 4D is a cross-sectional view of a semiconductor structure after depositing an polymer microchannel layer having a plurality of vias on the structure; and FIG. 4E is a cross-sectional view of a semiconductor structure after filling the vias with liquid metal.

FIGS. 5A-5I illustrate an exemplary fabrication process of forming flexible electronics using doped silicon strain gauge according to one or more embodiments, in which:

FIG. 5A is a cross-sectional view of a semiconductor structure after doping a silicon substrate;

FIG. 5B is a cross-sectional view of a semiconductor structure after patterning a photoresist layer on the structure;

FIG. 5C is a cross-sectional view of a semiconductor structure after depositing a metal ohmic contact material on the structure;

FIG. 5D is a cross-sectional view of a semiconductor structure after removing photoresist and lifting off the metal from the first photoresist layer.

FIG. 5E is a cross-sectional view of a semiconductor structure after patterning a second photoresist layer and depositing a metal conductive layer on the structure;

FIG. 5F is a cross-sectional view of a semiconductor structure after patterning a third photoresist layer on the structure;

FIG. 5G is a cross-sectional view of a semiconductor structure after plating conductive material on the exposed metal conductive layer;

FIG. 5H is a cross-sectional view of a semiconductor structure after applying UV release tape to the structure; and FIG. 5I is a cross-sectional view of a semiconductor structure after spalling.

DETAILED DESCRIPTION

Various applications could benefit from improved large scale manufacturing methods for mechanically robust, electrically sensitive and flexible devices, including health care, solar cell applications, and flexible optoelectronics including LED and laser applications. In health care applications, for example, bio-inspired structures that incorporate a sensing element and polymer can be desirable in evaluating a number of medical conditions.

Electronics for use in biological applications can measure a change in resistance, mechanical strain, heart pulse, and the like. However, the use of electronics in some biological applications requires contact with biological surfaces, such as the human skin, which can present uneven and non-planar surfaces. To ensure sufficient contact between the electronics and the biological surface, flexibility of the materials can be needed. Using existing semiconductor materials can be possible in such applications if the materials are sufficiently thin to withstand larger mechanical deformation.

The ability to complex, as well as the reliability and performance of thinned down semiconductor materials can be on the same level as solid-state electronics on conventional bulk substrates. However, presently semiconductor bulk substrate materials cannot be conventionally fabricated to the desired thicknesses, which can be on the order of 10 microns. Non-standard processes can provide thinned down semiconductor materials from a thicker bulk substrate, but such methods can be difficult to perform in mass production.

For example, FIGS. 1A-1C illustrate one known process for forming a thinned down semiconductor using a spalling technique. As shown in FIG. 1A, a layer with tensile stress 102 can be deposited on a substrate 100, such as a silicon substrate. Layer with tensile stress, or tensile layer, 102 can be a layer of metal under tensile strain, for instance tensile strained Ni. Next, as shown in FIG. 1B, a flexible handle layer 104 can be disposed on the tensile layer. Handle layer 104 can include, for example a plastic or metal foil that is operatively associated with, i.e., glued, adhered, or bonded to the tensile layer. Then, as shown in FIG. 1C, a known spalling technique can include lifting the tensile layer 102 by means of the attached flexible handle layer 104 to create a thin layer of silicon ribbon from the silicon substrate 100. Although this method can result in a thin silicon ribbon, it is difficult to achieve on a large scale.

Embodiments described herein provide methods for manufacturing highly sensitive flexible sensors and electronics using scalable methods. In some embodiments, methods can include using metal strain gauge on flexible silicon combined with a liquid metal interconnect. In some embodiments, methods include using doped silicon strain gauge on flexible silicon, combined with a liquid metal interconnect.

Figure 2A:
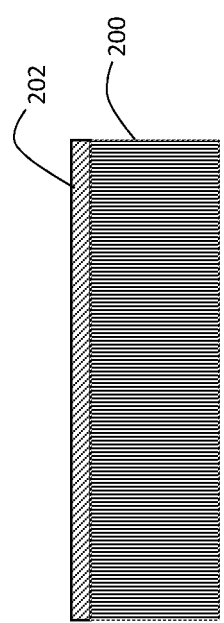

FIGS. 2A-2I illustrate an exemplary fabrication process of forming flexible electronics using metal strain gauge according to one or more embodiments. FIG. 2A is a cross-sectional view illustrating a semiconductor structure after forming an insulating layer 202 on a bulk silicon substrate 200. In some embodiments, the insulating layer is an oxide layer, including for instance silicon dioxide or glass.

Figure 2B:
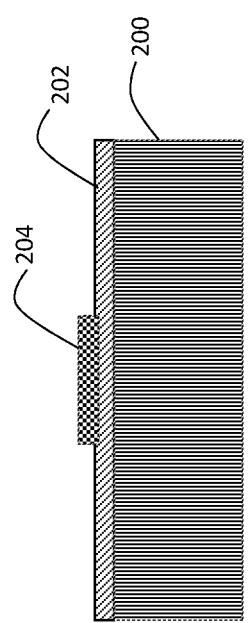

FIG. 2B is a cross-sectional view illustrating metal patterning on a semiconductor substrate according to one or more embodiments. A metal 204 is deposited on the insulting layer 202. The metal 204 can include any metal that changes resistance, for example, upon application of an external force. In preferred embodiments, metal 204 includes platinum or aluminum. The type of metal 204 can be chosen based upon the intended application. For example, the metal 204 can include platinum, copper, gold, palladium, nickel, chromium, manganese, or alloys, for instance platinum palladium alloy, copper manganese nickel alloy (e.g., manganine) or nickel chromium alloy (e.g., nichrome).

In some embodiments, the resistance of the metal strain gauge is several Ω to several thousand Ω, for example 50Ω to 5000Ω.

Figure 2C:
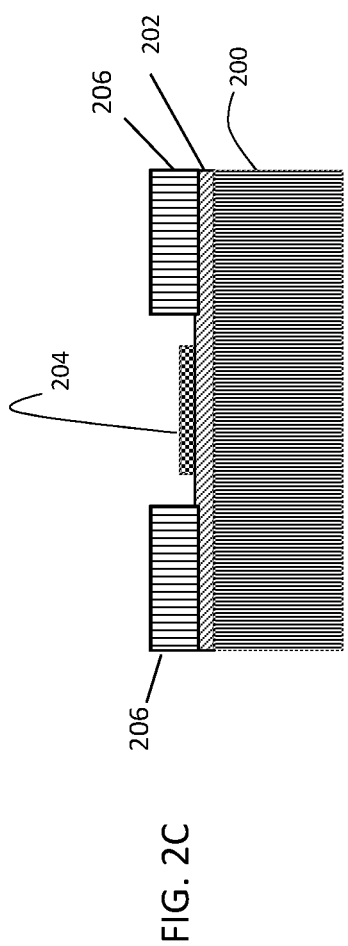

As is illustrated in FIG. 2C, in one or more embodiments, a first photoresist layer 206 can be patterned on the structure to mask a portion of the insulating layer 202 and expose the metal 204 and a portion of the insulating layer 202.

Figure 2D:
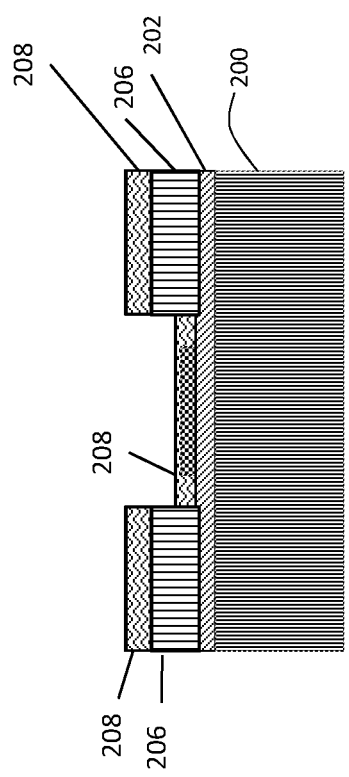

As is illustrated in FIG. 2D, in one or more embodiments, a metal conductive layer 208 can be deposited on the structure. The metal conductive layer 208 can be a seed layer, for example, including titanium and nickel. In some embodiments, the metal conductive layer 208 includes a thin layer of titanium deposited on the structure and a layer of nickel deposited on the titanium. The metal conductive layer 208 can have a thickness of 2 angstroms (Å) to 200 nanometers, or from 10 nm to 100 nm.

Figure 2E:
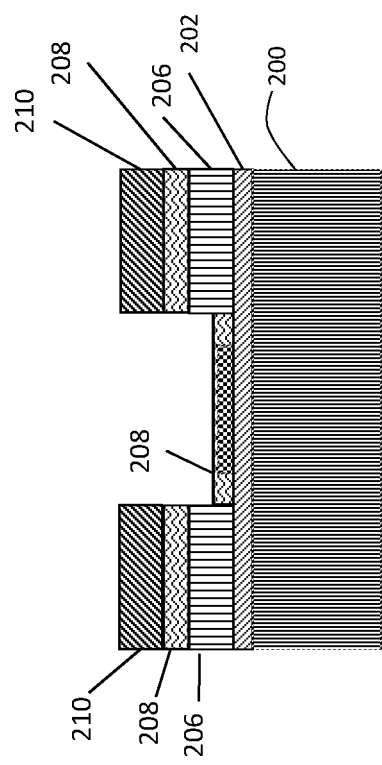

As is illustrated in FIG. 2E, in one or more embodiments, a second photoresist layer 210 is patterned on the structure.

For example, the second photoresist layer 210 can mask the structure in the same pattern as the first photoresist layer 202.

Figure 2F:
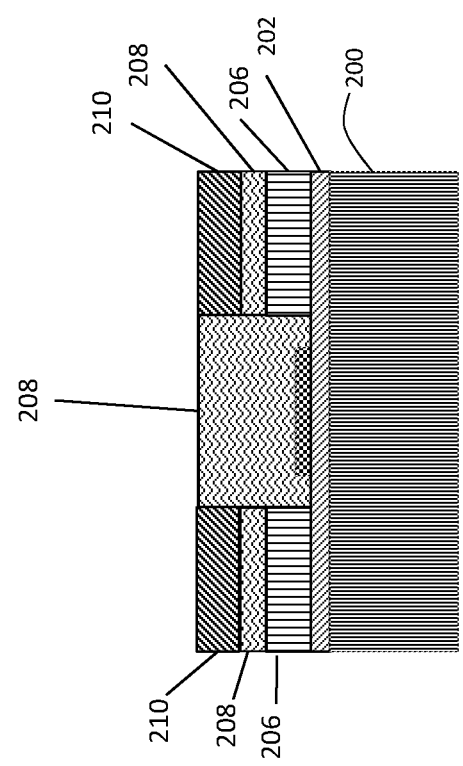

As is illustrated in FIG. 2F, in one or more embodiments, a conductive material is plated on the structure, for instance by electroplating. In preferred embodiments, the conductive material includes metal of the same type as metal from the metal conductive layer 208. In some embodiments, the conductive material is nickel and has a thickness of 5 to 10 μm, or 5 to 6 μm. The metal can be plated to any thickness. For example, the metal can be plated to the top of the first or second photoresist layer.

Figure 2G:
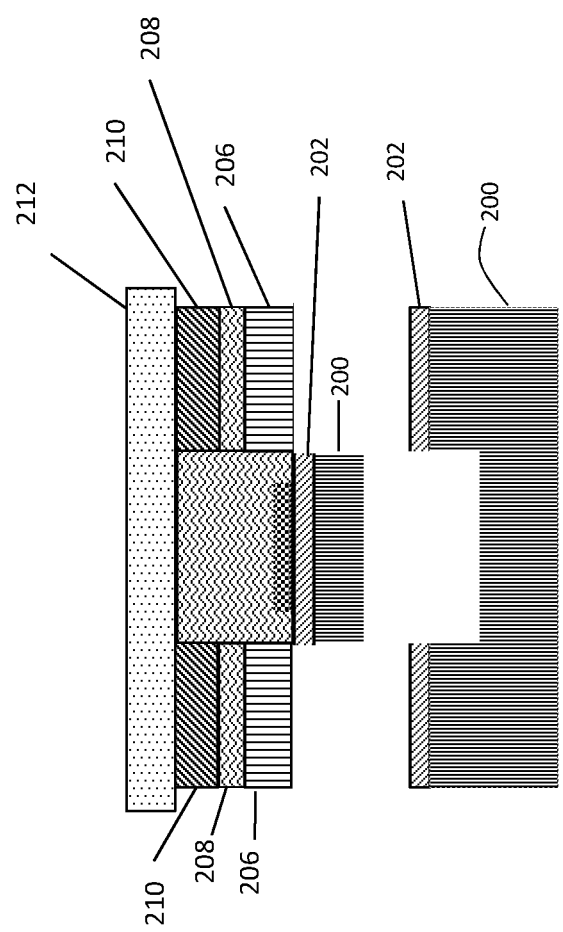

As is illustrated in FIG. 2G, in one or more embodiments, a tape 212 can be deposited on the structure. Tape 212 can be, for example, a flexible handle layer 104 or another material that can bond to the structure to effect spalling. Then, as illustrated, the structure can be spalled, such that a thin layer of silicon from the bulk silicon substrate 200 and adjacent insulating layer 202 are removed from the bulk substrate 202 in regions unmasked by the photoresist layers 206 and 210, such that the thin layer of silicon 200 and adjacent insulating layer 202 remain in contact with the metal and conductive material. As is shown, in some embodiments, all silicon substrate and oxide layer below the photoresist layers can be removed from the structure.

Figure 2H:
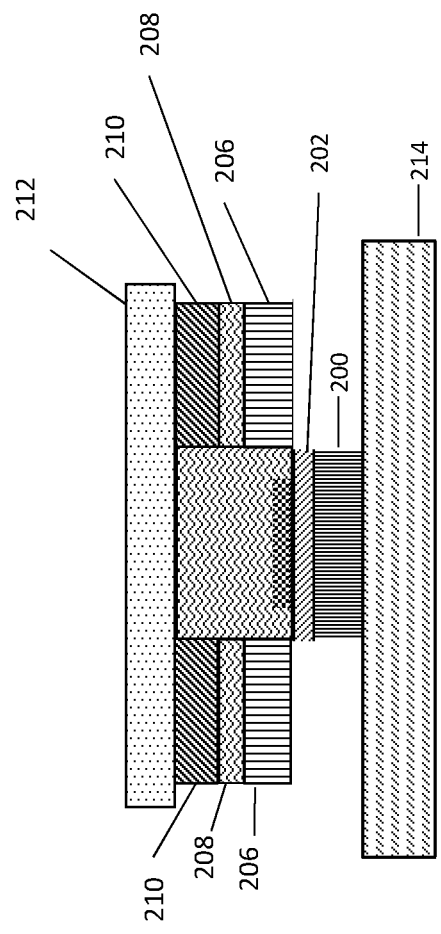

As is illustrated in FIG. 2H, in one or more embodiments, the spalled structure can be applied to an ultraviolet (UV) release tape 214. The UV release tape can include materials that have the desired adhesive properties, adequate thermal stability for the desired process, and that demonstrate UV wavelength sensitivity at a wavelength useful for a debonding process. UV release tapes are known and can include, for example tapes containing carbon underlayers, spin-on carbon (SOC) materials, or organic planarizing layers (OPL).

Figure 2I:
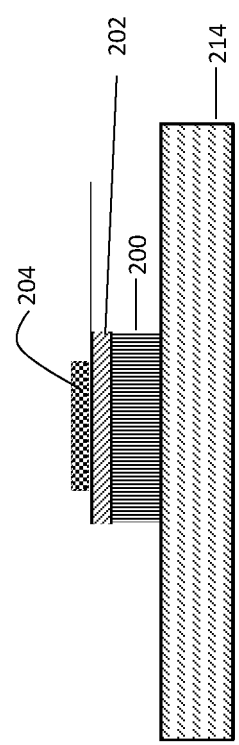

As is illustrated in FIG. 2I, in one or more embodiments, the tape, photoresist layers, and conductive material can be removed from the structure to create a spalled device layer. The spalled device layer can include the metal 204, an insulating layer 202, a silicon layer 200, and UV-release tape 214.

Figure 3A:
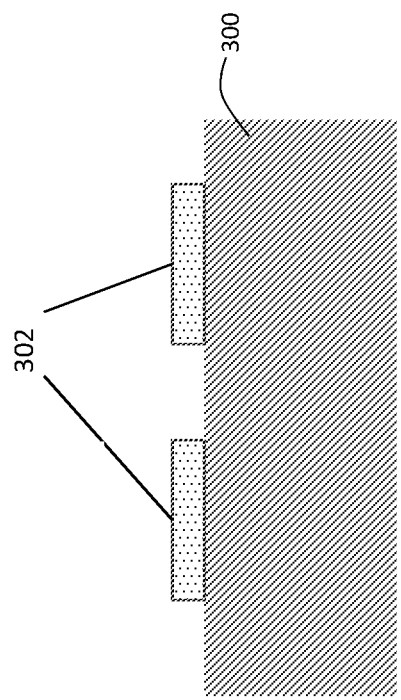

FIGS. 3A-3D illustrate an exemplary fabrication process of forming an polymer microchannel layer for flexible electronics according to one or more embodiments. As is illustrated in FIG. 3A, the exemplary method can include patterning a mask 302 onto a mechanical support 300. In some embodiments, the mold can contain include, for example, photoresist on silicon or silicon on glass. The mask 302 can be patterned with known photolithographic techniques.

Figure 3B:
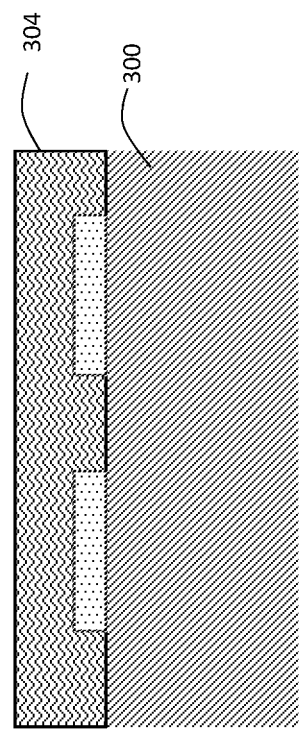
Figure 3C:
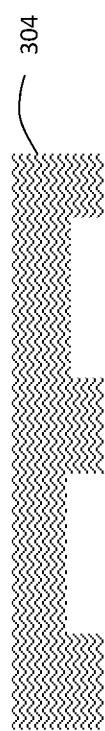

As is illustrated in FIG. 3B, a polymer microchannel 304, for example a polymer (e.g. PDMS) layer can be applied to the structure to form a pattern in the polymer microchannel 304 based upon the mask 302. In some embodiments, a silicon support and mask can be coated with a hydrophobic layer, such as a silane layer, prior to adding a polymer (e.g. PDMS) layer. Then, as is illustrated in FIG. 3C, the patterned polymer microchannel 304 can be removed from the mask and mechanical support. In some embodiments, the polymer microchannel has a thickness greater than or equal to 50 μm.

Figure 3D:
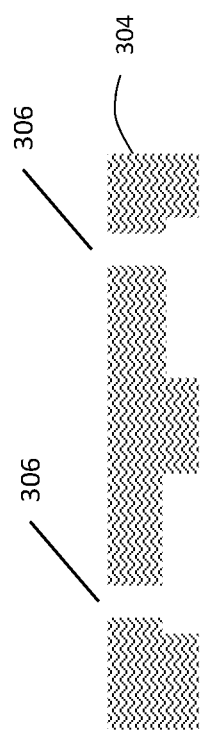

As is illustrated in FIG. 3D, two or more vias 306 can be formed in the polymer microchannel 304. In some embodiments, the vias 306 can be formed by mechanical punch or by drilling.

In some embodiments, the resultant polymer microchannel 304 can be applied to a flexible electronic structure.

Figure 4A:
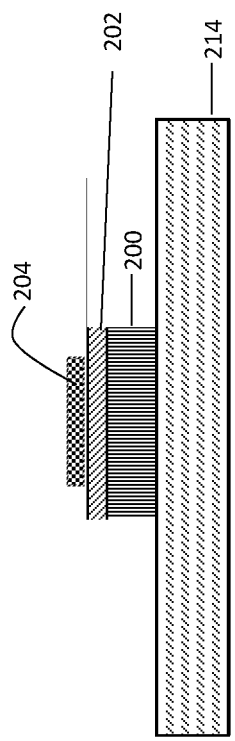
Figure 4B:
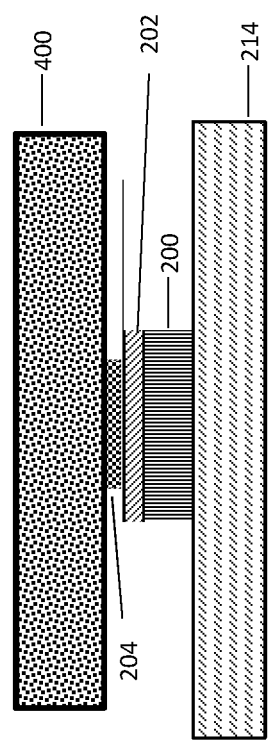

FIGS. 4A-4E illustrate an exemplary process of fabricating flexible electronics with an polymer microchannel according to one or more embodiments. FIG. 4A is a cross-sectional view illustrating a spalled device layer according to one or more embodiments. As is illustrated in FIG. 4B, a transfer tape 400 can be deposited on the structure, for example a transfer tape 400 can be adhered to the metal 204.

Figure 4C:
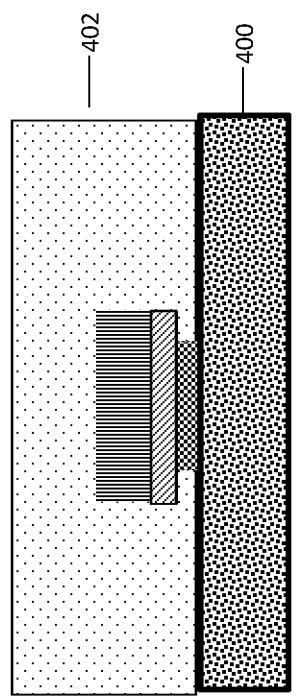
Figure 4D:
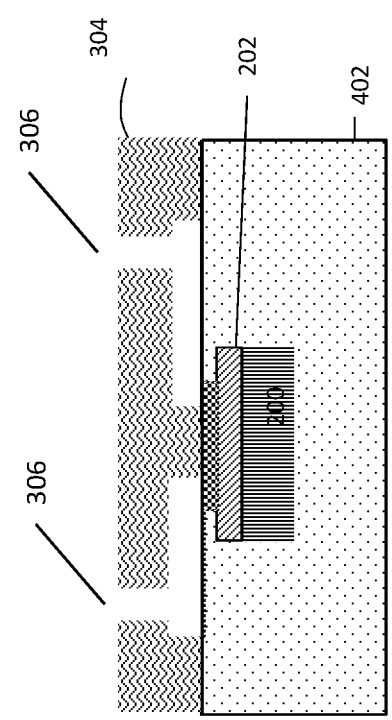

In some embodiments, as is illustrated in FIG. 4C, the method of fabrication includes embedding the spalled structure in a polymer (e.g. PDMS) layer. Next, as is shown in FIG. 4D, in some embodiments, a polymer microchannel 304 can be deposited on the structure and bonded such that the metal 204 is in contact with a plurality of vias 306.

Figure 4E:
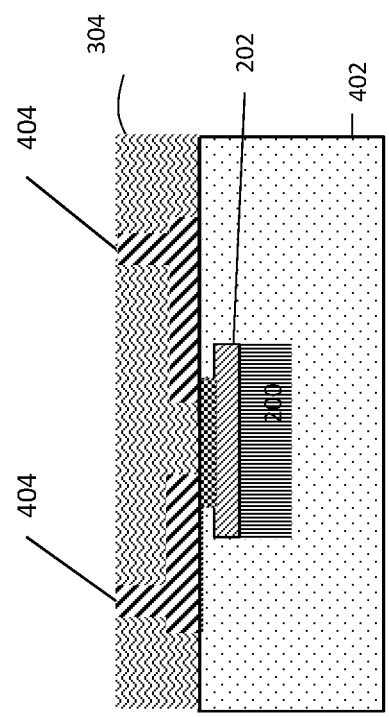

As is illustrated in FIG. 4E, a liquid metal 304 can be applied to the vias 304. In preferred embodiments, the liquid metal 304 can be in contact with metal or a doped silicon region, not shown, and can thereby form a connection to the outer surface of the polymer (e.g. PDMS) layer. The liquid metal 304 can include any conductive metal material that is liquid at room temperature. For example, liquid metal can include eutectic liquid metal alloys, such as those containing gallium (Ga), indium (In), tin (Sn), or combinations thereof. In some embodiments, the liquid metal is Galistan (68.5% Ga, 21.5% In, and 10% Sn, by weight).

Figure 5A:
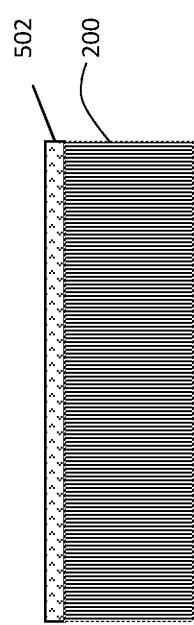

FIGS. 5A-5I illustrate an exemplary fabrication process of forming flexible electronics using doped silicon strain gauge according to one or more embodiments. FIG. 5A is a cross-sectional view illustrating a silicon substrate 200 with a doped silicon layer 502. Doping can be selective doping, such that a specific area or region of the substrate is doped, or doping can be non-selective, for example such that the entire silicon substrate is doped. Non-limiting examples of suitable dopant materials include p-type dopants (e.g., boron), n-type dopants (e.g., phosphorus), or any combination thereof.

In some embodiments, the resistance of the doped silicon strain gauge is several $\Omega$ to several thousand $\Omega$, for example 50$\Omega$ to 5000$\Omega$.

Figure 5B:
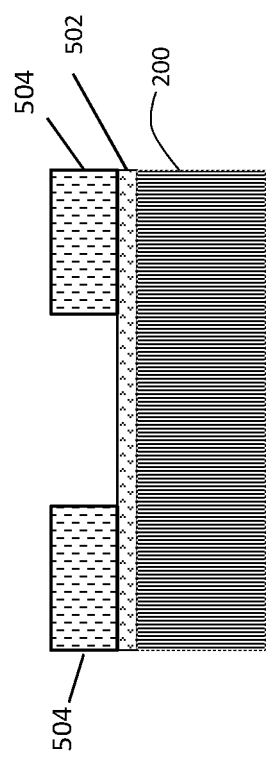

As is illustrated in FIG. 5B, in one or more embodiments, a first photoresist layer 504 can be patterned on the structure, such as on the doped silicon layer 502.

Figure 5C:
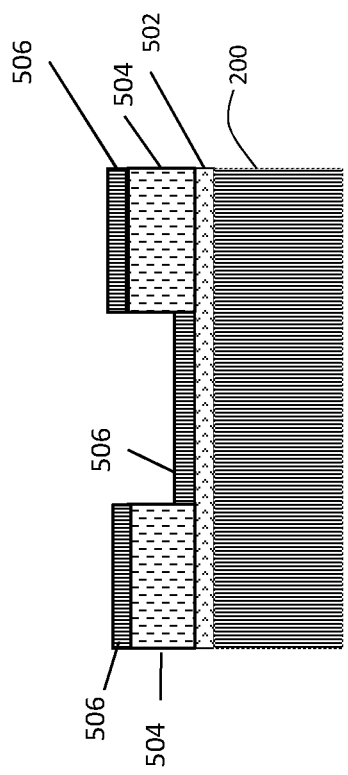
Figure 5D:
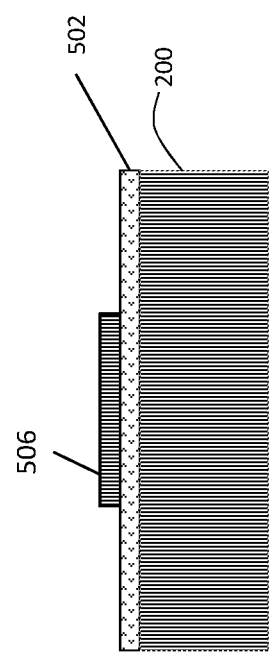

As is illustrated in FIG. 5C, an exemplary method includes depositing a metal ohmic contact material 506 on the structure. In some embodiments, the metal ohmic contact material 506 includes gold, nickel, titanium, aluminum, silicide, or combinations thereof. FIG. 5D illustrates the structure after removing photoresist and lifting off the metal ohmic contact material from the first photoresist layer 504.

Figure 5E:
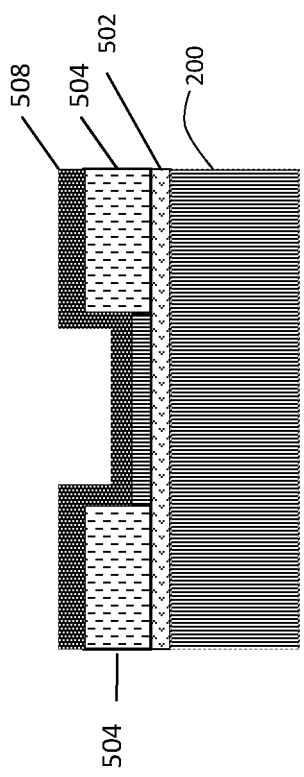

As is illustrated in FIG. 5E, in one or more embodiments, a method includes depositing a second photoresist layer and depositing a metal conductive layer 508 on the structure. In some embodiments, the metal conductive layer 508 includes nickel. For example, the metal conductive layer can act as a seed layer for subsequent metal plating.

Figure 5F:
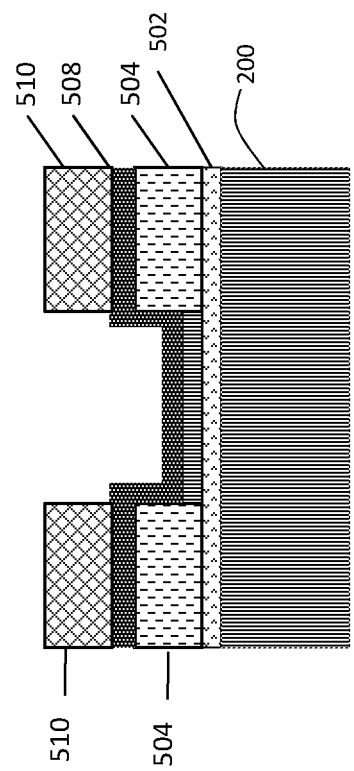

FIG. 5F illustrates an exemplary structure after patterning a third photoresist layer 510 according to one or more embodiments. The second photoresist layer 510 can be patterned in the same manner as the first photoresist layer 504. In some embodiments, the second photoresist layer 510 is patterned such that the metal conductive layer 508 is exposed in a portion of the structure.

Figure 5G:
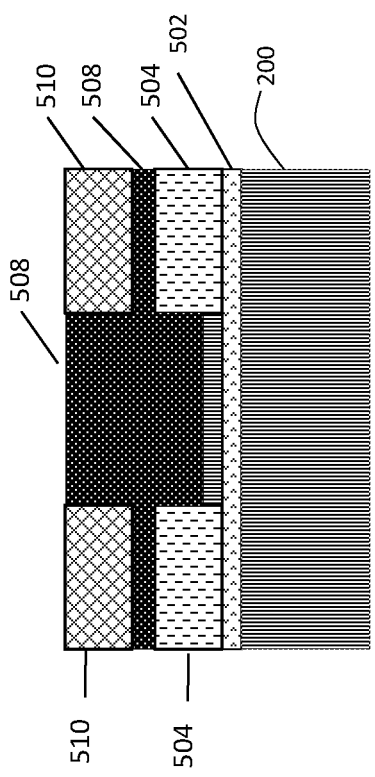

As is illustrated in FIG. 5G, in some embodiments, conductive material of the conductive layer 508 can be plated on the structure such that the height of the exposed conductive layer increases. In some embodiments, nickel is plated on the exposed conductive layer to the height of the first or second photoresist layer, preferably the second photoresist layer.

Figure 5H:
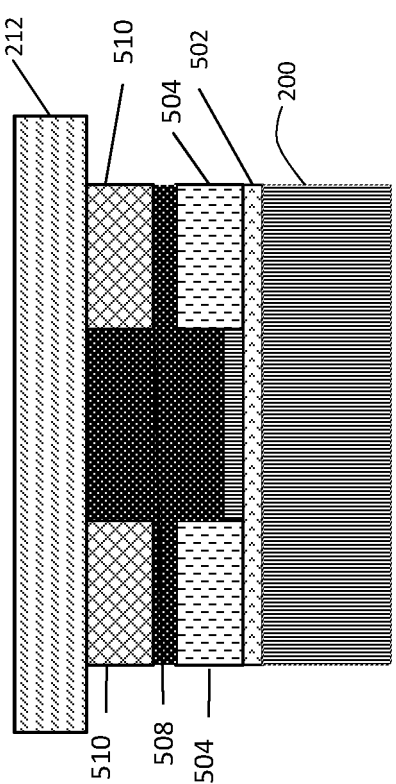

In some embodiments, UV release tape is applied to the structure after plating. FIG. 5H is a cross-sectional view of a semiconductor structure after applying tape 212 to the structure.

Figure 5I:
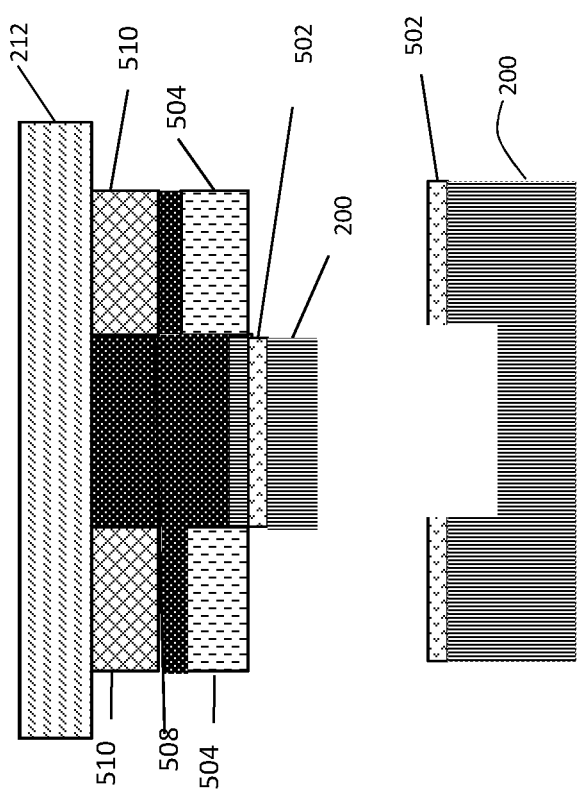

As is illustrated in FIG. 5I, the structure can be spalled, such that a thin layer of silicon from the bulk silicon substrate 200 and adjacent doped silicon 502 are removed from the silicon substrate 200 in regions unmasked by the photoresist layers 504 and 510, such that the thin layer of silicon 200 and adjacent doped silicon 502 remain in contact with the conductive material 508. In some embodiments, all silicon substrate and oxide layer below the photoresist layers can be removed from the structure.

In some embodiments, not shown, after spalling, a UV release tape can be applied to the silicon on the spalled structure. In some embodiments, after applying a UV release tape, the conductive layer 508, photoresist layers 504 and 510, and UV release tape 212 can be removed from the structure. In some embodiments, the spalled structure can then be bonded to a polymer microchannel as described herein.

The shapes and dimensions of the flexible electronic structures can vary depending upon the desired application. For example, but not by way of limitation, the flexible electronic structures can be manufactured in a bar shape, a u shape, or an m shape. The flexible electronic structures can be connected in any pattern, depending upon the desired application.

Flexible electronic structures manufactured according to methods described herein can be used in a variety of biological and medical applications. For instance, one of the Unified Parkinson's Disease Rating Scale (UPDRS) items measures finger tapping in daily neurological applications to assess bradykinesia and disturbances of rhythm formation. Assessment of finger tapping can include measurement of velocity, amplitude, and rhythm of tapping. While conventional evaluation of these factors is subjective, flexible electronic structures can provide objective data for such analyses. For instance, flexible electronic structures described herein can measure a distance between a finger and a thumb or can include an accelerometer to provide data concerning movement in three dimensions. For example, a strain gauge sensor can provide a simple linear relation between a change in resistance of the sensor and the strain applied to the sensor.

Deposition is any process that grows, coats, or otherwise transfers a material onto a substrate. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography, nanoimprint lithography, and reactive ion etching.

The etching process can include a dry etch (e.g., reactive ion etching, plasma etching, ion beam etching, or laser ablation). The etching process can alternatively include a wet chemical etch (e.g., with potassium hydroxide, or sulfuric acid and hydrogen peroxide). In some exemplary embodiments, both dry etching and wet chemical etching processes can be used. After transferring the pattern, the patterned photoresist is removed utilizing resist stripping processes, for example, ashing. Ashing can be used to remove a photoresist material, amorphous carbon, or organic planarization (OPL) layer. Ashing is performed using a suitable reaction gas, for example, $O_2$, $N_2$, $H_2/N_2$, $O_3$, $CF_4$, or any combination thereof.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for manufacturing a flexible electronic structure, the method comprising:
   doping a silicon substrate with a dopant;
   patterning a first photoresist layer on the structure to create a masked region and an unmasked region;
   depositing a metal ohmic contact material on the structure;
   removing the metal ohmic contact material from the first photoresist layer;
   depositing a conductive layer on the structure;
   patterning a second photoresist layer on the structure;
   plating a conductive material on the structure;
   adhering a UV release tape to the structure; and
   spalling the structure to create a thin layer of silicon below the unmasked region.

2. The method of manufacturing according to claim 1, wherein the doping is selective doping to create a doped region.

3. The method of manufacturing according to claim 1, wherein the dopant is boron, phosphorus, or a combination thereof.

4. The method of manufacturing according to claim 1, wherein the metal ohmic contact material comprises gold, titanium, nickel, silicide, aluminum, or combinations thereof.

* * * * *